United States Patent
Lou et al.

(10) Patent No.: US 10,184,957 B2
(45) Date of Patent: Jan. 22, 2019

(54) TESTING APPARATUS, HOLDING ASSEMBLY, AND PROBE CARD CARRIER

(71) Applicant: STAR TECHNOLOGIES, INC., Hsinchu (TW)

(72) Inventors: Choon Leong Lou, Hsinchu (TW); Ho Yeh Chen, Hsinchu (TW); Li Min Wang, Hsinchu (TW); Hsiao Ting Tseng, Hsinchu (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 141 days.

(21) Appl. No.: 15/254,813

(22) Filed: Sep. 1, 2016

(65) Prior Publication Data

US 2017/0370966 A1    Dec. 28, 2017

(30) Foreign Application Priority Data

Jun. 22, 2016 (TW) .............................. 105119523 A

(51) Int. Cl.
*G01R 3/00* (2006.01)
*G01R 1/073* (2006.01)

(52) U.S. Cl.
CPC ........... *G01R 3/00* (2013.01); *G01R 1/07342* (2013.01)

(58) Field of Classification Search
CPC ... G01R 1/07342; G01R 1/18; G01R 1/06711
See application file for complete search history.

(56) References Cited

U.S. PATENT DOCUMENTS

| | | | |
|---|---|---|---|
| 5,461,327 A * | 10/1995 | Shibata .............. | G01R 1/07314 324/72.5 |
| 7,498,825 B2 | 3/2009 | Eldridge et al. | |
| 2005/0156613 A1* | 7/2005 | Hosaka .............. | G01R 1/07342 324/756.03 |
| 2008/0048700 A1* | 2/2008 | Lou .......................... | G01R 1/44 324/750.08 |
| 2008/0116917 A1* | 5/2008 | Kanev ................ | G01R 31/2889 324/750.19 |
| 2009/0039906 A1* | 2/2009 | Yamada ............. | G01R 1/07378 324/762.05 |
| 2009/0184725 A1* | 7/2009 | Tunaboylu ......... | G01R 1/07342 324/754.07 |
| 2010/0127726 A1* | 5/2010 | Abe .................... | G01R 31/2889 324/756.03 |

(Continued)

FOREIGN PATENT DOCUMENTS

TW    M463903    10/2013

*Primary Examiner* — Giovanni Astacio-Oquendo
*Assistant Examiner* — Alvaro Fortich
(74) *Attorney, Agent, or Firm* — WPAT, P.C., Intellectual Property Attorneys; Anthony King

(57) ABSTRACT

The present disclosure provides a testing apparatus, a holding assembly and a probe card carrier. In some embodiments of the present disclosure, the testing apparatus includes a basic circuit board having a first surface and a second surface; a holding assembly disposed on the first surface; a signal transfer assembly disposed on the second surface and electrically connected to the basic circuit board; and a probe card carrier configured to carry a probe card. In some embodiments of the present disclosure, when the probe card carrier is assembled to the holding assembly, the probe card is electrically connected to the signal transfer assembly.

37 Claims, 12 Drawing Sheets

(56) References Cited

U.S. PATENT DOCUMENTS

2010/0176831 A1* 7/2010 Palcisko ............ G01R 1/07378
324/756.03
2012/0139572 A1* 6/2012 Kim .................. G01R 31/2889
324/754.07

* cited by examiner

TESTING APPARATUS, HOLDING ASSEMBLY, AND PROBE CARD CARRIER

TECHNICAL FIELD

The present disclosure relates to a testing apparatus, a holding assembly, and a probe card carrier, and more particularly, to a testing apparatus, a holding assembly, and a probe card carrier capable of easily and quickly replacing a probe card.

DISCUSSION OF THE BACKGROUND

Generally, it is necessary to test the electrical characteristics of a semiconductor device, such as the integrated circuit devices at the wafer level, to check whether the integrated circuit device meets product function and breakdown specifications. Integrated circuit devices with electrical characteristics meeting the specifications are selected for the subsequent packaging process, while other devices are discarded to avoid additional packaging cost. Other full function electrical tests are performed on the integrated circuit device after the packaging process is completed so as to screen out substandard devices and guarantee product quality. In other words, during fabrication of an integrated circuit chip, multiple tests for electrical properties have to be performed.

FIG. 1 shows a testing system 10 for testing a device under test (DUT) 31 (for example, a semiconductor device) according to the prior art. The testing system 10 includes a housing 11 (for defining a testing chamber 13), a stand 17 disposed in the housing 11, a base 30 disposed on the stand 17 for receiving the DUT 31, a head plate 15 (having an opening 19) disposed on the housing 11, and a probe card 40 disposed on the head plate 15. The DUT 31 is disposed on the base 30 with a heater 33.

The probe card 40 includes a circuit board 41, a supporter 45 disposed on the circuit board 41, and a plurality of probes 43 fixed on the supporter 45 with epoxy resin 47. The circuit board 41 has a first surface 42A and a second surface 42B, and a front end of a probe 43 and the DUT 31 facing the second surface 42B can form an electrical connection. A rear end of a probe 43 is electrically connected to a wiring 53 on the first surface 42A of the circuit board 42 through a conductive channel 51 inside the circuit board 41. During the test, the base 30 is raised so as to form an electrical contact between the front end of the probe 43 and a pad 35 of the DUT 31 such that an electrical connection is established between the probe card 40 and the DUT 31. During the test, a testing signal is transmitted to the DUT 31 through the probe 43 of the probe card 40, and a response signal of the DUT 31 is transmitted outside of the probe card 40 through the probe 43 for further analysis so as to implement the electrical property test of the DUT 31.

When a failure occurs on the probe card 40 and the probe card 40 has to be replaced, in the prior art, the whole probe card 40 has to be disassembled from the testing system 10, checked, repaired and reassembled to the testing system 10, and then the test can be re-performed. For example, even if only a part of the probes 43 are worn due to long-term use and have to be replaced, in the prior art, the whole probe card 40 has to be dissembled from the testing system 10, checked, repaired and reassembled to the testing system 10, and then the test can be re-performed. This process is obviously time-consuming. In addition, the location of the probe 43 of the probe card 40 has to be correspondingly adjusted according to different types of the DUT 31. In the prior art, the whole probe card 40 has to be dissembled from the testing system 10, a new probe card 40 is reassembled to the testing system 10, and then the test can be re-performed. Such process is obviously time-consuming as well.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

The present disclosure provides a testing apparatus, a holding assembly, and a probe card carrier capable of easily and quickly replacing a probe card.

One aspect of the present disclosure provides a testing apparatus comprising a basic circuit board having a first surface and a second surface; a holding assembly disposed on the first surface; a signal transfer assembly disposed on the second surface and electrically connected to the basic circuit board; and a probe card carrier configured to carry a probe card, wherein when the probe card carrier is assembled to the hold assembly, the probe card is electrically connected to the signal transfer assembly.

Another aspect of the present disclosure provides a testing apparatus comprising a basic circuit board having a first surface and a second surface; a holding assembly disposed on the first surface; and a probe card carrier configured to carry a probe card, wherein the probe card carrier is assembled to the holding assembly from the first surface, and the second surface faces a device under test.

Another aspect of the present disclosure provides a holding assembly comprising a mounting base; a movable member rotatably attached to the mounting base; and a probe card carrier placed on the movable member, wherein when the movable member rotates relative to the mounting base, the probe card carrier is moved along a direction from an upper side to a lower side of the mounting base.

Another aspect of the present disclosure provides a probe card carrier comprising a pillar; a gripping portion disposed on a top surface of the pillar; and a holding portion disposed on a bottom surface of the pillar; wherein the pillar comprises at least one actuating groove recessing inward from an outer wall of the pillar.

In some embodiments of the present disclosure, the holding assembly comprises an opening, and the probe card carrier is assembled to the opening.

In some embodiments of the present disclosure, the mounting base comprises a plurality of guiding members protruding toward the opening.

In some embodiments of the present disclosure, the movable member comprises a plurality of actuating members protruding toward the opening, and when the movable member rotates relative to the mounting base, the probe card carrier is driven by the plurality of actuating members to move along a direction from the first surface to the second surface.

In some embodiments of the present disclosure, the second surface faces a device under test, and the probe card carrier is assembled to the holding assembly from the first surface.

In some embodiments of the present disclosure, the holding assembly comprises an opening, and when the probe card carrier is assembled to the holding assembly from the first surface, the probe card passes through the opening along a direction from the first surface to the second surface.

In some embodiments of the present disclosure, the second surface faces a device under test, and the probe card carrier is disassembled from the holding assembly on the first surface.

In some embodiments of the present disclosure, the holding assembly comprises an opening, and when the probe card carrier is disassembled from the holding assembly on the first surface, the probe card passes through the opening along a direction from the second surface to the first surface.

In some embodiments of the present disclosure, the pillar comprises at least one guiding groove recessing inward from an outer wall of the pillar, and the at least one guiding groove vertically extends from the top surface to the bottom surface.

In some embodiments of the present disclosure, the pillar comprises at least one actuating groove recessing inward from an outer wall of the pillar.

In some embodiments of the present disclosure, the at least one actuating groove comprises a vertical region extending vertically from the bottom surface; and an inclined region extending upward from the vertical region in a tilt manner.

In some embodiments of the present disclosure, the testing apparatus further comprises a reinforcing member disposed on the first surface; and a plurality of elastic members disposed between the reinforcing member and the holding assembly.

In some embodiments of the present disclosure, the probe card comprises a plurality of probes configured to contact a device under test positioned below the second surface.

In some embodiments of the present disclosure, when assembling the probe card carrier to the holding assembly from the first surface, the probe card is placed below the second surface through the opening from the first surface; when disassembling the probe card carrier from the holding assembly on the first surface, the probe card passes through the opening from the second surface such that the probe card is disassembled from the first surface. In other words, in the present disclosure, the probe card is removed/replaced from an upper side of a head plate rather than from a lower side of the head plate (inside the housing) such that it is unnecessary to open the housing so as to avoid affecting the testing environment of the testing chamber inside the housing.

In some embodiments of the present disclosure, when the probe card fails and thus has to be replaced (for example, only a part of the probes are worn due to long-term use and have to be replaced), in the present disclosure, it is unnecessary to disassemble the whole testing apparatus from the testing system; instead, the operation of the present disclosure is to disassemble the probe card from the testing apparatus through the probe card carrier, and then check, repair and reassemble the probe card to the testing apparatus for re-performing the test. In addition, for different types of device under test, the location of the probe of the probe card has to be correspondingly changed. In the technology of the present disclosure, it is unnecessary to disassemble the whole testing apparatus from the testing system; instead, the operation of the present disclosure is to disassemble the probe card from the testing apparatus through the probe card carrier, and then reassemble a new probe card for performing the test for different types of devices under test.

In some embodiments of the present disclosure, with the mechanism design of the holding assembly (a guiding member and an actuating member) and the probe card carrier (a guiding groove and an actuating groove), it is unnecessary to use tools for removing/replacing the probe card such that the probe card can be easily removed/replaced, and furthermore, the probe card can be quickly removed/replaced.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
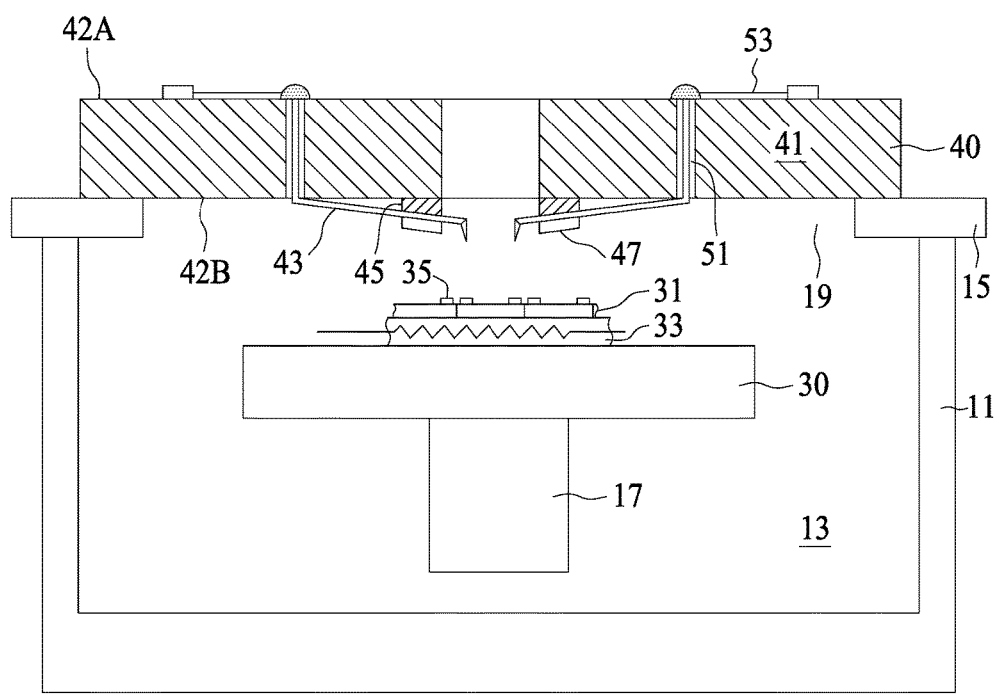
FIG. 1 a cross-sectional view showing a testing system according to the prior art.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that when one feature is formed on another feature or a substrate, other features can be present therebetween.

Figure 2:
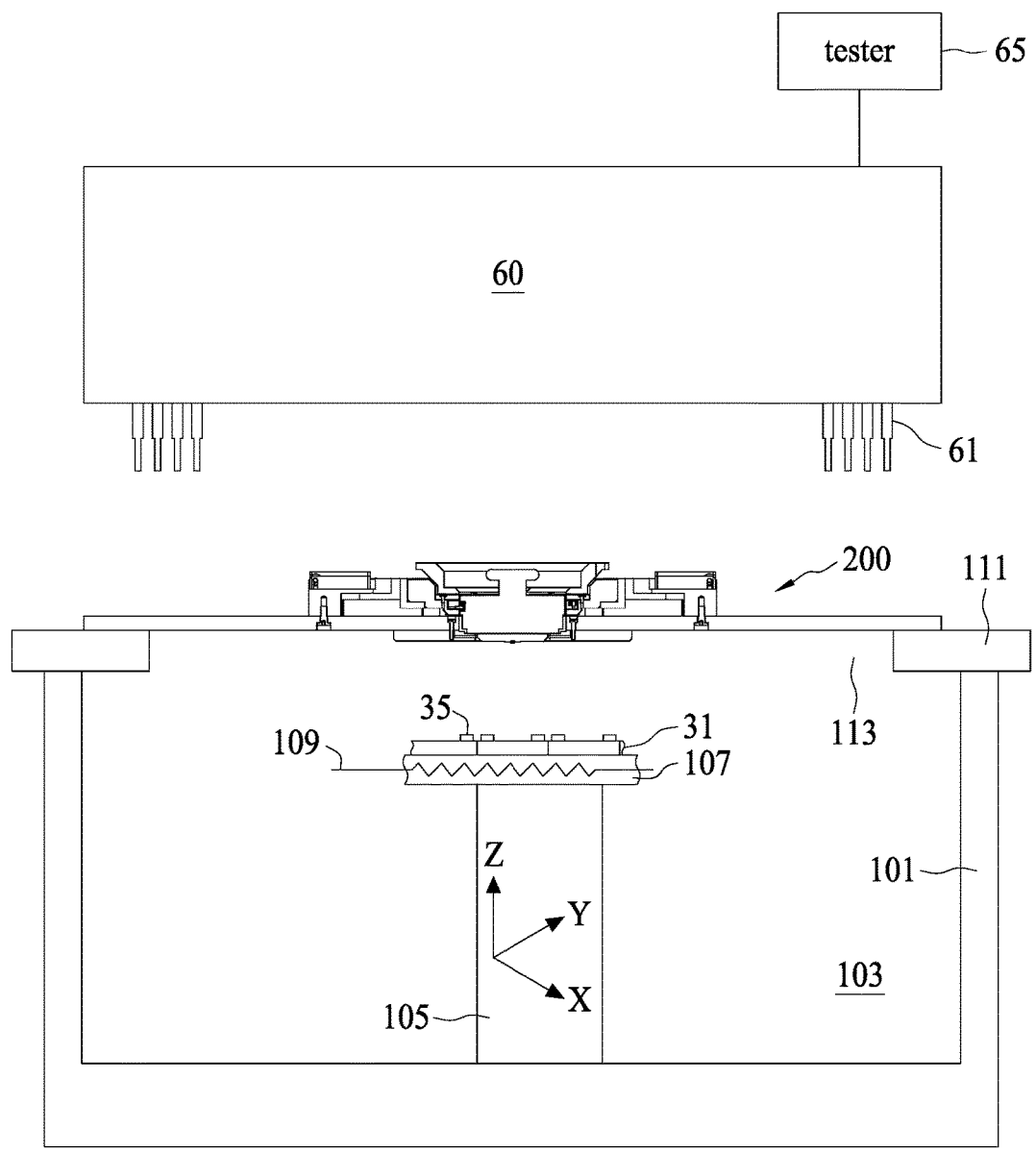
FIG. 2 is a cross-sectional view showing a testing system according to some embodiments of the present disclosure.

FIG. 2 is a cross-sectional view showing a testing system 100 for testing a device under test (DUT) 31 (for example, a semiconductor device, an integrated circuit chip, a circuit board, etc.) according to some embodiments of the present disclosure. In the present embodiment, the testing system 100 includes a housing 101 (for defining a testing chamber 103), a three-dimensional stand 105 disposed in the housing 101, a device holder 107 (such as a chuck disposed in the housing 101 for holding the DUT 31), a temperature control member 109 (for example, a heater) disposed in the device holder 107 and configured to control a temperature of the device holder 107, a head plate 111 (having an opening 113) disposed on the housing 101, a testing apparatus 200 disposed on the head plate 111, a test head 60 disposed over the testing apparatus 200, and an external tester 65 electrically connected to the test head 60. In some embodiments of the present disclosure, an electrical connection between the test head 60 and the DUT 31 is established by the testing apparatus 200.

Figure 3:
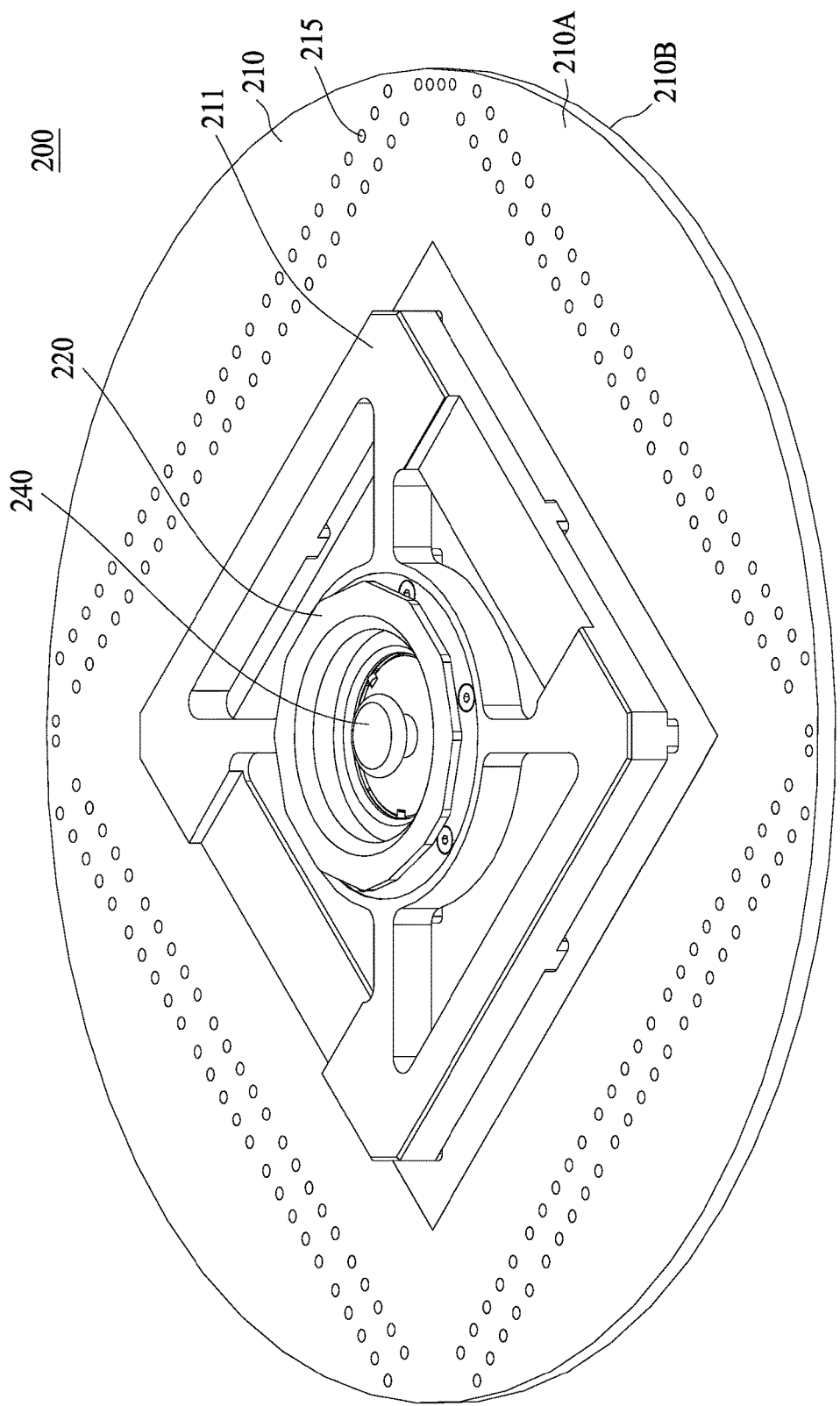
FIG. 3 is an assembled view showing the testing apparatus in FIG. 2 according to some embodiments of the present disclosure.
Figure 4:
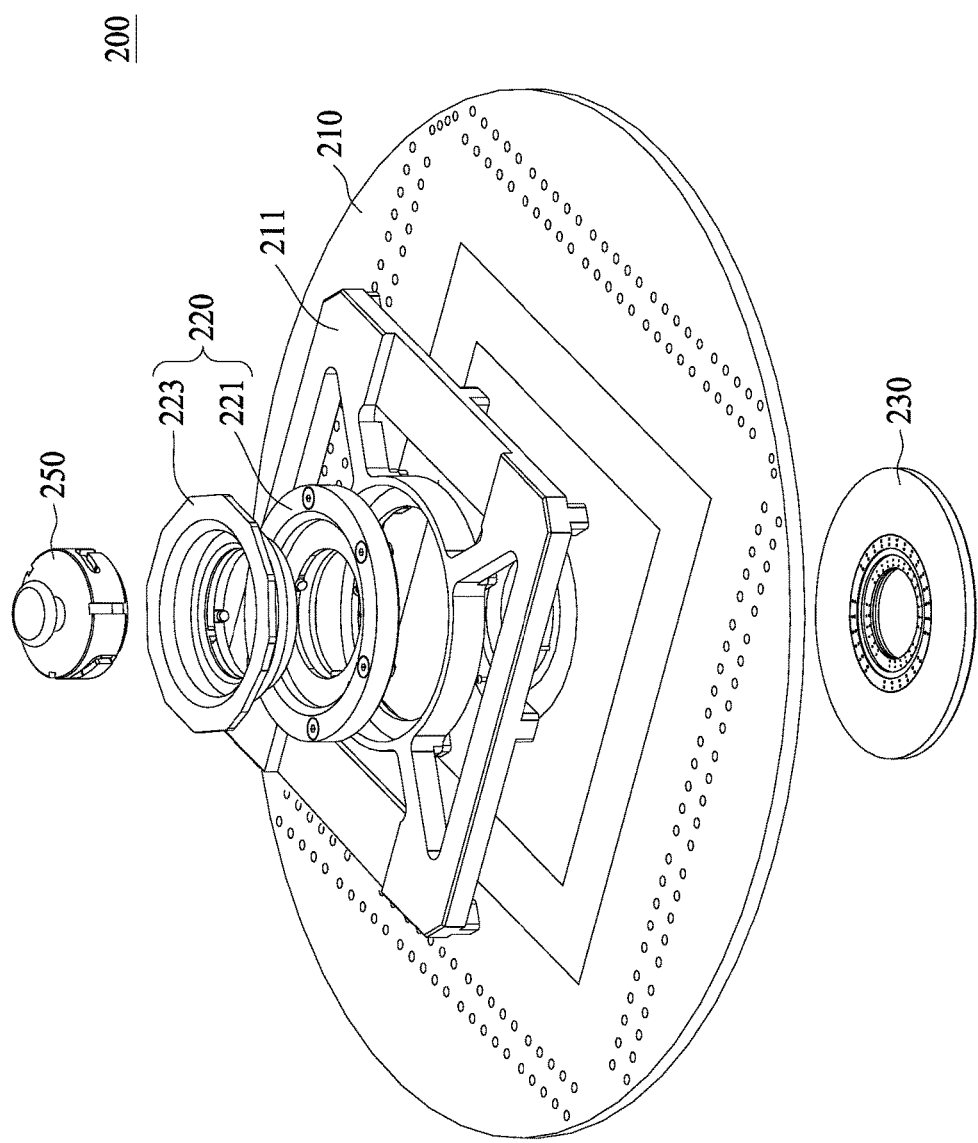
FIG. 4 is a disassembled view of the testing apparatus in FIG. 3 according to some embodiments of the present disclosure.
Figure 5:
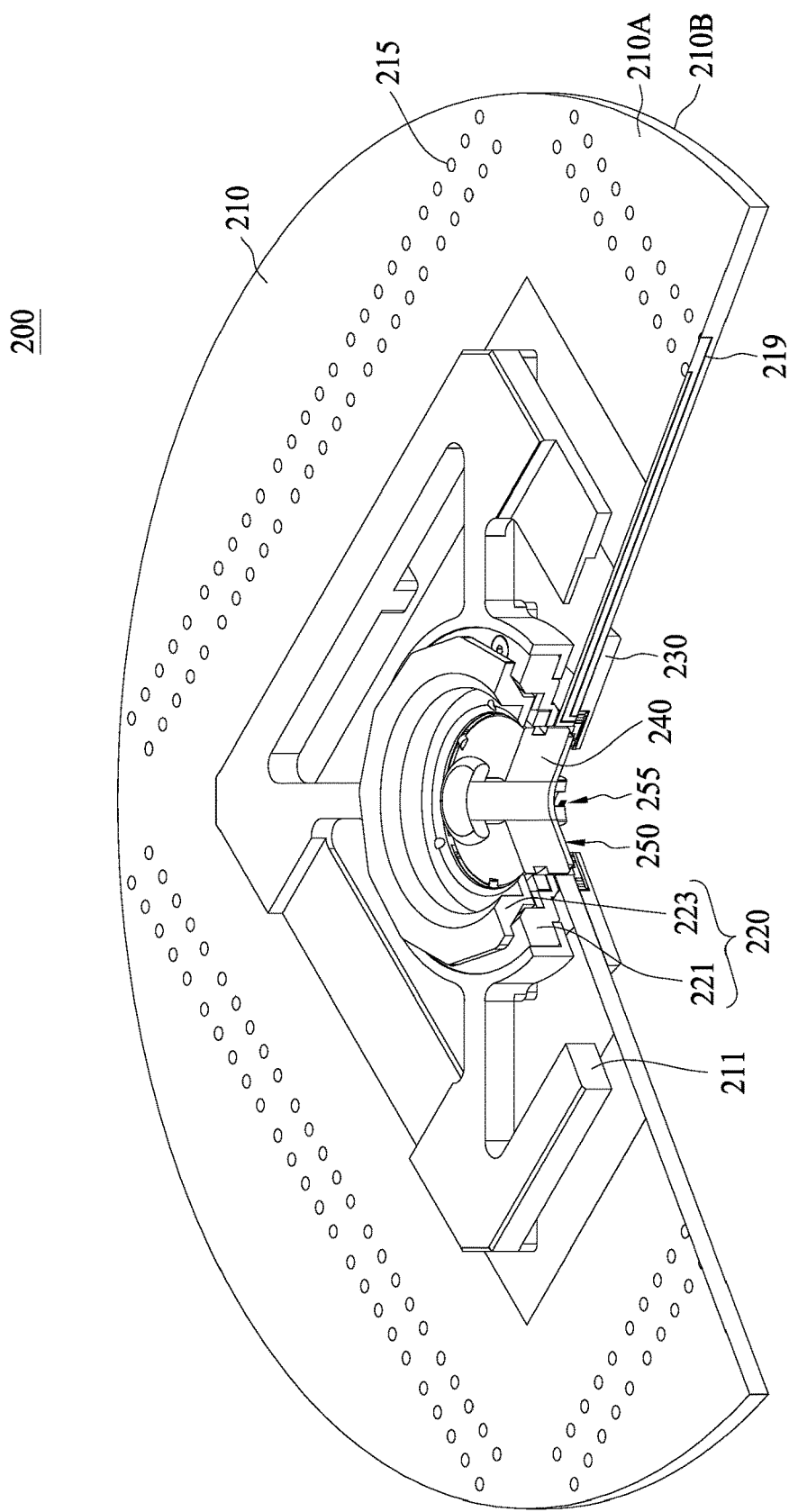
FIG. 5 is a partial cross-sectional view of the testing apparatus in FIG. 3 according to some embodiments of the present disclosure.

FIG. 3 is an assembled view of the testing apparatus 200 in FIG. 2 according to some embodiments of the present disclosure, FIG. 4 is a disassembled view of the testing apparatus 200 in FIG. 3, and FIG. 5 is a partial cross-sectional view of the testing apparatus 200 in FIG. 3. In some embodiments of the present disclosure, the testing apparatus 200 includes a basic circuit board 210 having a first surface 210A and a second surface 210B; a holding assembly 220 disposed on the first surface 210A; a signal transfer assembly 230 disposed on the second surface 210B and electrically connected to the basic circuit board 210; and a probe card carrier 240 configured to carry a probe card 250, wherein when the probe card carrier 240 is assembled to the holding assembly 220, the probe card 250 is electrically connected to the signal transfer assembly 230. In some embodiments of the present disclosure, the second surface 210B faces the DUT 31, and the probe card carrier 240 is assembled to the holding assembly 220 from the first surface 210A and disassembled from the holding assembly 220 from the first surface 210A.

Referring to FIG. 3 and FIG. 5, in some embodiments of the present disclosure, the testing apparatus 200 further includes a reinforcing member 211 disposed on the first surface 210A, and the holding assembly 220 is disposed on the reinforcing member 211 of the first surface 210A.

Figure 6:
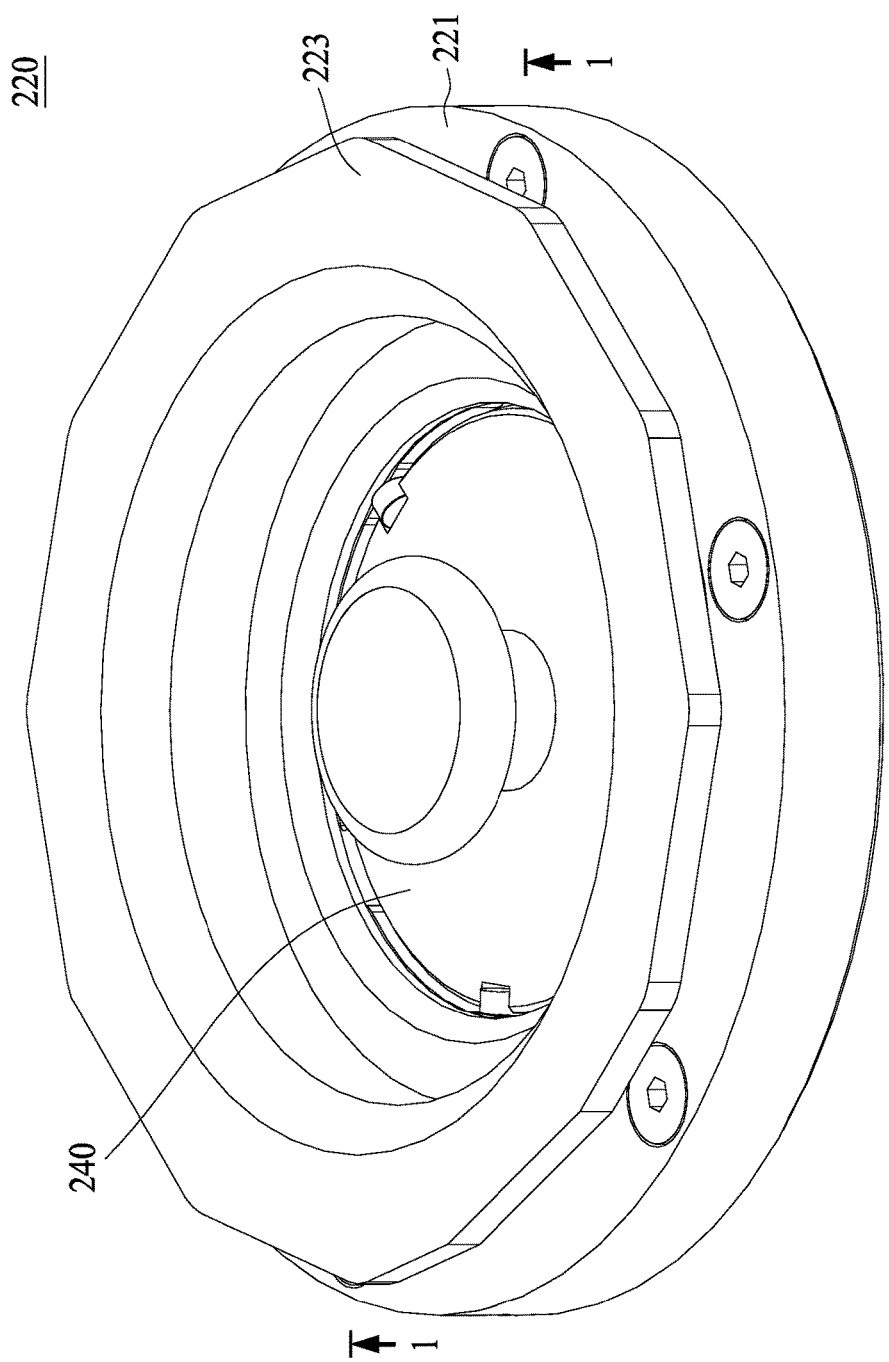
FIG. 6 is an assembled view showing a holding assembly according to some embodiments of the present disclosure.
Figure 7:
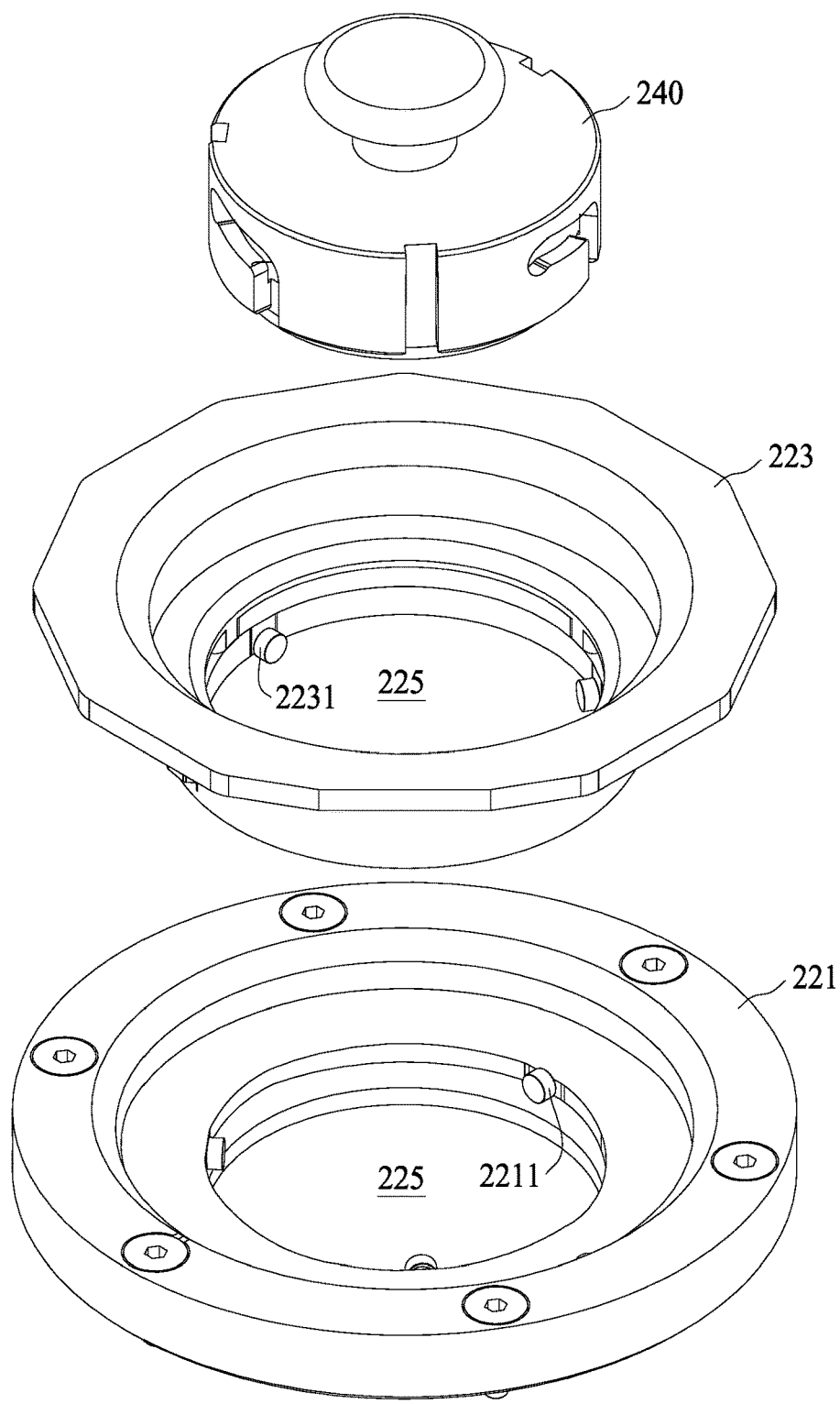
FIG. 7 is a disassembled view of the holding assembly in FIG. 6 according to some embodiments of the present disclosure.
Figure 8:
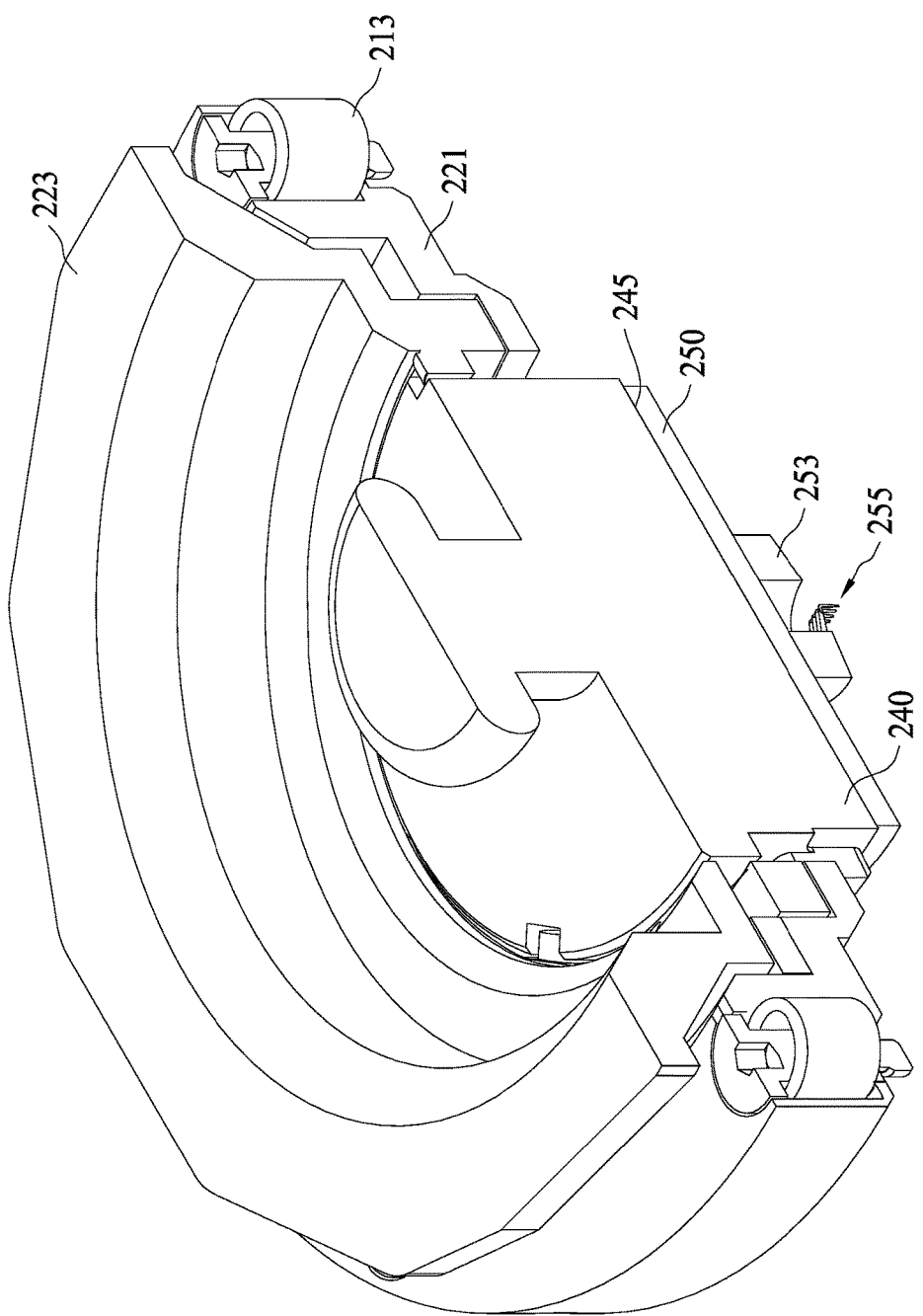
FIG. 8 is a cross-sectional view along a cross-sectional line 1-1 in FIG. 6 according to some embodiments of the present disclosure.

FIG. 6 is an assembled view showing the holding assembly 220 according to some embodiments of the present disclosure, FIG. 7 is a disassembled view of the holding assembly 220 in FIG. 6, and FIG. 8 is a cross-sectional view along a cross-sectional line 1-1 in FIG. 6, wherein the probe card carrier 240 and the probe card 250 have been assembled in the holding assembly 220. In some embodiments of the present disclosure, the holding assembly 220 includes a mounting base 221 and a movable member 223, wherein the mounting base 221 is disposed on the first surface 210A of the basic circuit board 210, and the movable member 223 is rotatably attached to the mounting base 221. In some embodiments of the present disclosure, when the movable member 223 rotates relative to the mounting base 221 (for example, in a counterclockwise rotation), the probe card carrier 240 moves along a direction from the upper side of the mounting base 221 (the first surface 210A) to the lower side of the mounting base 221 (the second surface 210B).

Referring to FIG. 7, in some embodiments of the present disclosure, the holding assembly 220 includes an opening 225, and the probe card carrier 240 is assembled in the opening 225; the mounting base 221 includes a plurality of guiding members 2211 such as guiding pins protruding toward the opening 225; and the movable member 223 includes a plurality of actuating members 2231 such as actuating pin protruding toward the opening 225. When the movable member 223 rotates relative to the mounting base 221, the probe card carrier 240 is driven by the plurality of actuating members 2231 to move along a direction from the upper side of the mounting base 221 (the first surface 210A) to the lower side of the mounting base 221 (the second surface 210B).

Referring to FIG. 8, in some embodiments of the present disclosure, the testing apparatus 200 further includes a plurality of elastic members 213 (for example, springs) disposed between the reinforcing member 211 and the holding assembly 220, wherein when the probe card 250 is assembled to the holding assembly 220 through the probe card carrier 240, the probe card 250 can be pressed down to the signal transfer assembly 230 by the elastic members 213 through the holding assembly 220. In some embodiments of the present disclosure, the actuating members 2231 can be elastic members for implementing a function that the probe card 250 is pressed down to the signal transfer assembly 230 by the actuating members 2231.

Figure 9:
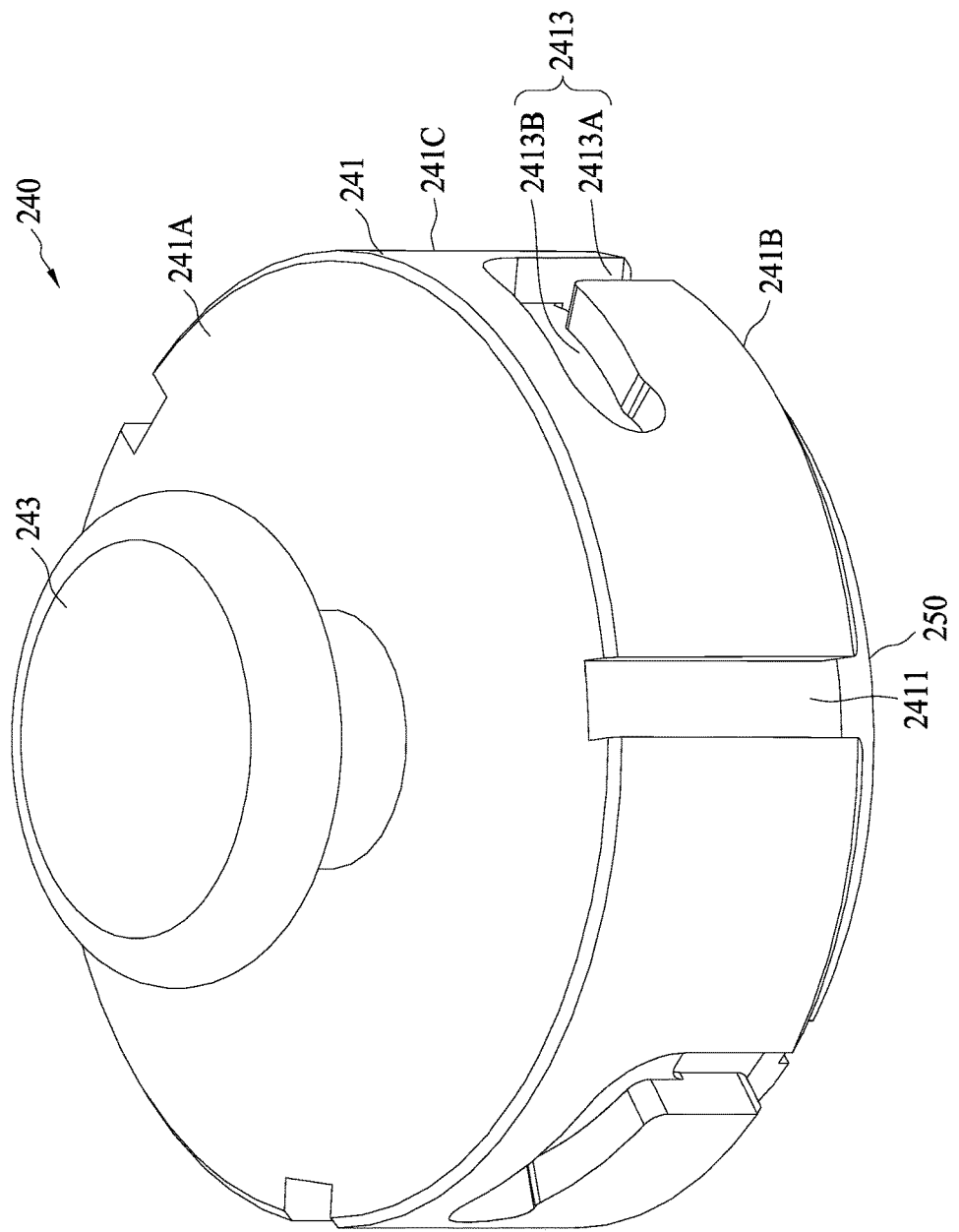
FIG. 9 is an assembled view showing a probe card carrier according to some embodiments of the present disclosure.
Figure 10:
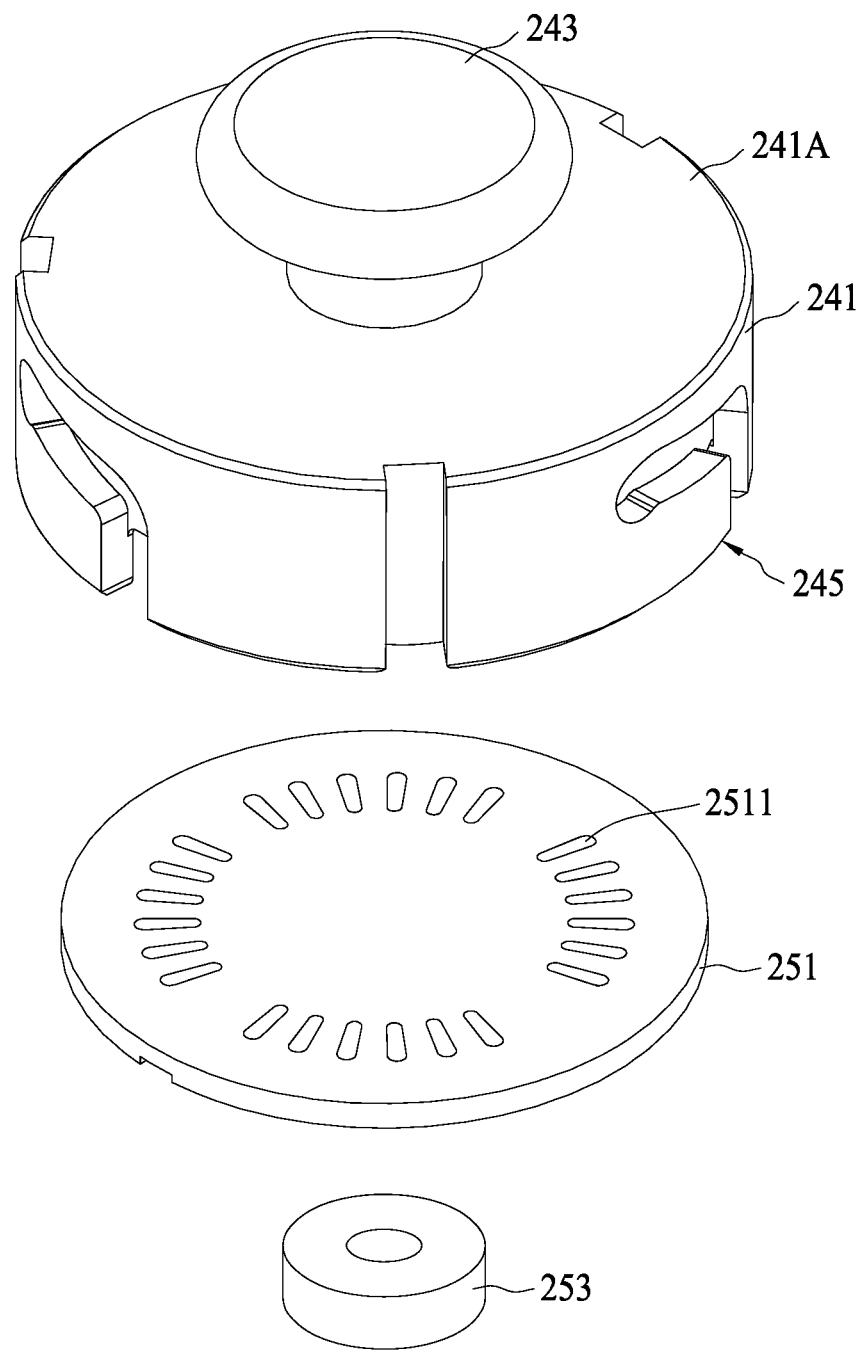
FIG. 10 is a disassembled view of the probe card carrier in FIG. 9 according to some embodiments of the present disclosure.

FIG. 9 is an assembled view showing the probe card carrier 240 according to some embodiments of the present disclosure, and FIG. 10 is a disassembled view of the probe card carrier 240 in FIG. 9. In some embodiments of the present disclosure, the probe card carrier 240 includes a pillar 241 and a gripping portion 243 disposed on a top surface 241A of the pillar 241, and the probe card 250 is disposed on a bottom surface 241B of the pillar 241. In some embodiments of the present disclosure, the pillar 241 includes at least one guiding groove 2411 recessing inward from an outer wall 241C of the pillar 241, and the guiding groove 2411 extends vertically from the top surface 241A to the bottom surface 241B. The pillar 241 includes at least one actuating groove 2413 recessing inward from the outer wall 241C of the pillar 241; the actuating groove 2413 including a vertical region 2413A and an inclined region 2413B; the vertical region 2413A extending vertically from the bottom surface 241B; and the inclined region 2413B extending upward from the vertical region 2413A in a tilt manner.

Referring to FIG. 8 and FIG. 10, in some embodiments of the present disclosure, the bottom surface 241B of the pillar 241 is a holding portion 245, and the probe card 250 is disposed on the holding portion 245, wherein the probe card 250 includes a circuit board 251, a probe supporting member 253 and a plurality of probes 255. In some embodiments of the present disclosure, a plurality of first conductive patterns 2511 are formed on an upper surface of the circuit board 251, a plurality of second conductive patterns 2512 are formed on a bottom surface of the circuit board 251 (shown in FIG. 12), and a rear end of the probe 255 is electrically connected to the first conductive pattern 2511 or the second conductive pattern 2512.

Figure 11:
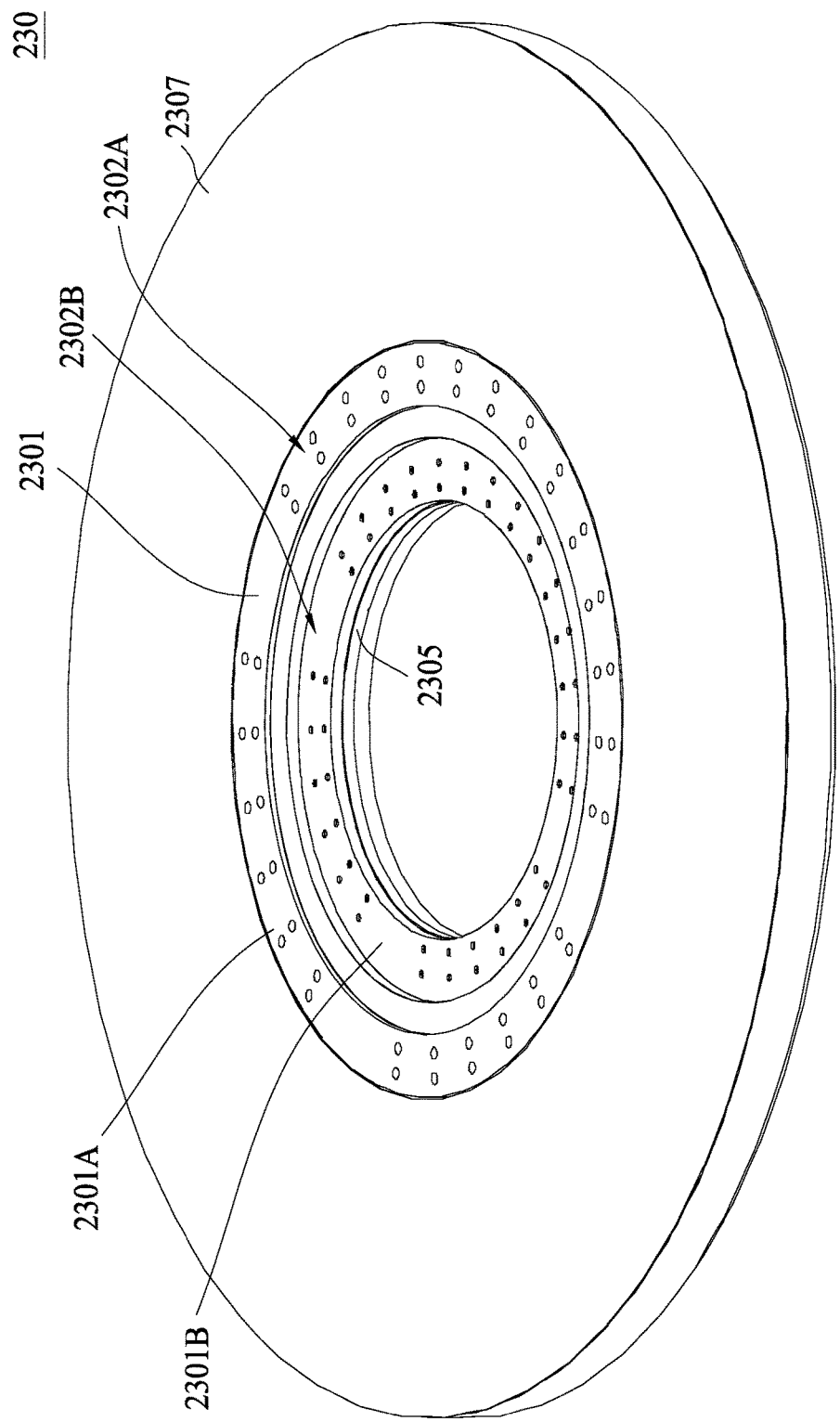
FIG. 11 is an assembled view showing a signal transfer assembly according to some embodiments of the present disclosure.
Figure 12:
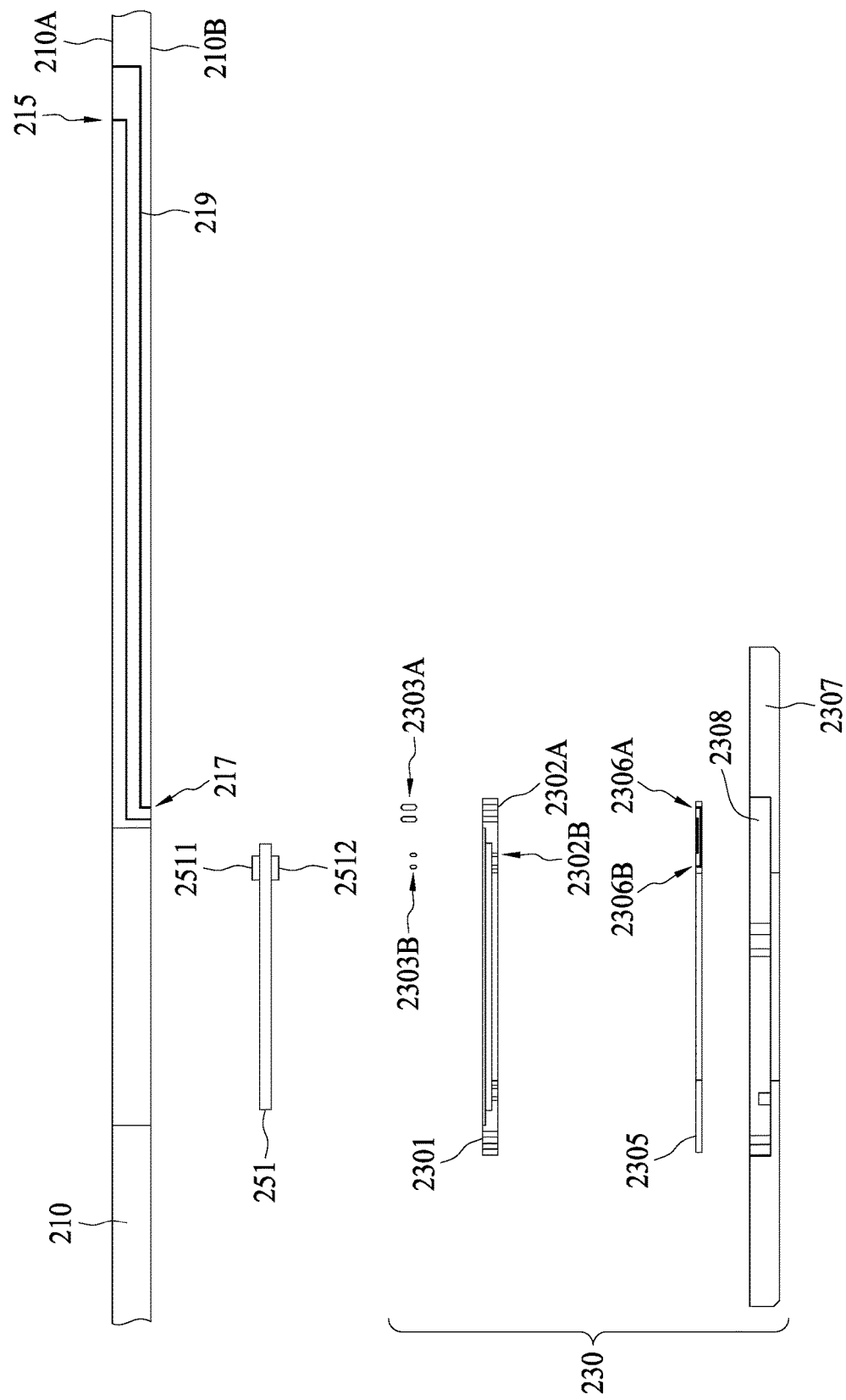
FIG. 12 is a disassembled view of the signal transfer assembly in FIG. 11 according to some embodiments of the present disclosure.

FIG. 11 is an assembled view showing the signal transfer assembly 230 according to some embodiments of the present disclosure, and FIG. 12 is a disassembled view of the signal transfer assembly 230 in FIG. 11. In some embodiments of the present disclosure, the signal transfer assembly 230 includes an intervening plate 2301, a plurality of conductive members 2303A, a plurality of conductive members 2303B, and a transfer circuit board 2305. In some embodiments of the present disclosure, the signal transfer assembly 230 further includes a bottom cover 2307 having a recess 2308, and the intervening plate 2301, the conductive members 2303A, the conductive members 2303B and the transfer circuit board 2305 are received in the recess 2308 and assembled to the second surface 210B of the basic circuit board 210 through the bottom cover 2307.

In some embodiments of the present disclosure, the intervening plate 2301 includes a plurality of outer ring holes 2302A and a plurality of inner ring holes 2302B, and the conductive members 2303A and the conductive members 2303B are received in the inner ring holes 2302A and the outer ring holes 2302B, respectively, wherein the conductive members 2303A and the conductive members 2303B can be elastic pins, such as pogo pins. In some embodiments of the present disclosure, there is a distance between an outer ring region 2301A where the outer ring holes 2302A are disposed and an inner ring region 2301B where the inner ring holes 2302B are disposed, and the height of the outer ring region 2301A is larger than that of the inner ring region 2301B.

In some embodiments of the present disclosure, an upper end of the conductive member 2303A contacts a conductive contact 217 on the second surface 210B of the basic circuit board 210, and a lower end of the conductive member 2303A contacts a conductive contact 2306A of the transfer circuit board 2305. In some embodiments of the present disclosure, when the probe card carrier 240 is assembled to the holding assembly 220, an upper end of the conductive member 2303B contacts a conductive pattern 2512 on a lower surface of the circuit board 251 of the probe card 250 such that the probe card 250 is electrically connected to the signal transfer assembly 230, and a lower end of the conductive member 2303B contacts a conductive contact 2306B of the transfer circuit board 2305.

Referring to FIG. 2 and FIG. 3, the test head 60 includes a plurality of pins 61, which are electrically connected to a plurality of conductive contacts 215 on the first surface 210A of the basic circuit board 210 during the test, and thus an electrical connection is established between the basic circuit board 210 and the test head 60.

Referring to FIG. 2 and FIG. 8, during the test, the three-dimensional stand 105 is raised such that a front end of the probe 255 of the probe card 250 electrically contacts a pad 35 of the DUT 31, and thus an electrical connection is established between the probe card 250 and the DUT 31.

Referring to FIG. 8, FIG. 12 and FIG. 2, during the test, when the probe card carrier 240 is assembled to the holding assembly 220, the conductive patterns 2512 on the lower surface of the circuit board 251 of the probe card 250 are electrically connected to the conductive members 2303B of the signal transfer assembly 230, the conductive members 2303B are electrically connected to the conductive members 2303A through the transfer circuit board 2305, the conductive members 2303A are electrically connected to the conductive contacts 217 on the second surface 210B of the basic circuit board 210, and the conductive contacts 217 are electrically connected to the conductive contacts 215 on the first surface 210A through a wiring 219 inside the basic circuit board 210. Accordingly, a testing signal of the tester 65 is transmitted to the DUT 31 through the test head 60 and the testing apparatus 200, and a response signal of the DUT 31 is transmitted to the tester 65 through the testing apparatus 200 and the test head 60 so as to achieve the electrical property test for the DUT 31.

In some embodiments of the present disclosure, when assembling the probe card carrier 240 to the holding assembly 220 from the first surface 210A, the probe card 250 is placed below the second surface 210B through the opening 225 from the first surface 210A; when disassembling the probe card carrier 240 from the holding assembly 220 on the first surface 210A, the probe card 250 passes through the opening 225 from the second surface 210B such that the probe card 250 is disassembled from the first surface 210A. In other words, in the present disclosure, the probe card 250 is removed/replaced from an upper side of the head plate 111 rather than from a lower side of the head plate 111 (inside the housing 101) such that it is unnecessary to open the housing 101 so as to avoid affecting the testing environment of the testing chamber 103 inside the housing 101.

In some embodiments of the present disclosure, when the probe card 250 fails and thus has to be replaced (for example, only a part of the probes 43 are worn due to long-term use and have to be replaced), in the present disclosure, it is unnecessary to disassemble the whole testing apparatus 200 from the testing system 100; instead, the operation of the present disclosure is to disassemble the probe card 250 from the testing apparatus 200 through the probe card carrier 240, and then check, repair and reassemble the probe card 250 to the testing apparatus 200 for re-performing the test. In addition, for different types of DUT 31, the location of the probe 255 of the probe card 250 has to be correspondingly changed. In the technology of the present disclosure, it is unnecessary to disassemble the whole testing apparatus 200 from the testing system 100; instead, the operation of the present disclosure is to disassemble the probe card 250 from the testing apparatus 200 through the probe card carrier 240, and then reassemble a new probe card 250 for performing the test for different types of DUT 31.

In some embodiments of the present disclosure, with the mechanism design of the holding assembly 220 (a guiding member and an actuating member) and the probe card carrier 240 (a guiding groove and an actuating groove), it is unnecessary to use tools for removing/replacing the probe card 250 such that the probe card 250 can be easily removed/replaced, and furthermore, the probe card 250 can be quickly removed/replaced.

One aspect of the present disclosure provides a testing apparatus including a basic circuit board having a first surface and a second surface; a holding assembly disposed on the first surface; a signal transfer assembly disposed on the second surface and electrically connected to the basic circuit board; and a probe card carrier configured to carry a probe card, wherein when the probe card carrier is assembled to the hold assembly, the probe card is electrically connected to the signal transfer assembly.

Another aspect of the present disclosure provides a testing apparatus including a basic circuit board having a first surface and a second surface; a holding assembly disposed on the first surface; and a probe card carrier configured to carry a probe card, wherein the probe card carrier is assembled to the holding assembly from the first surface, and the second surface faces a device under test.

Another aspect of the present disclosure provides a holding assembly including a mounting base; a movable member rotatably attached to the mounting base; and a probe card carrier placed on the movable member, wherein when the movable member rotates relative to the mounting base, the probe card carrier is moved along a direction from an upper side to a lower side of the mounting base.

Another aspect of the present disclosure provides a probe card carrier including a pillar; a gripping portion disposed on a top surface of the pillar; and a holding portion disposed on a bottom surface of the pillar; wherein the pillar includes at least one actuating groove recessing inward from an outer wall of the pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A testing apparatus, comprising:
    a basic circuit board having a first surface and a second surface;
    a holding assembly disposed on the first surface;
    a signal transfer assembly disposed on the second surface and electrically connected to the basic circuit board; and
    a probe card carrier configured to carry a probe card, wherein when the probe card carrier is assembled to the hold assembly, the probe card is electrically connected to the signal transfer assembly,
    wherein the second surface faces a device under test, and the probe card carrier is assembled to the holding assembly from the first surface, the holding assembly comprises an opening, and when the probe card carrier is assembled to the holding assembly from the first surface, the probe card passes through the opening along a direction from the first surface to the second surface.

2. The testing apparatus of claim 1, wherein the holding assembly comprises:
    a mounting base disposed on the first surface; and
    a movable member rotatably attached to the mounting base.

3. The testing apparatus of claim 2, wherein when the movable member rotates relative to the mounting base, the probe card carrier is moved along a direction from the first surface to the second surface.

4. The testing apparatus of claim 2, wherein the holding assembly comprises an opening, and the probe card carrier is assembled to the opening.

5. The testing apparatus of claim 4, wherein the mounting base comprises a plurality of guiding members protruding toward the opening.

6. The testing apparatus of claim 4, wherein the movable member comprises a plurality of actuating members protruding toward the opening, and when the movable member rotates relative to the mounting base, the probe card carrier is driven by the plurality of actuating members to move along a direction from the first surface to the second surface.

7. The testing apparatus of claim 1, wherein the probe card carrier is disassembled from the holding assembly on the first surface.

8. The testing apparatus of claim 7, when the probe card carrier is disassembled from the holding assembly on the first surface, the probe card passes through the opening along a direction from the second surface to the first surface.

9. The testing apparatus of claim 1, wherein the probe card carrier comprises:
    a pillar; and
    a gripping portion disposed on a top surface of the pillar;
    wherein the probe card is disposed on a bottom surface of the pillar.

10. The testing apparatus of claim 9, wherein the pillar comprises at least one guiding groove recessing inward from an outer wall of the pillar, and the at least one guiding groove vertically extends from the top surface to the bottom surface.

11. The testing apparatus of claim 9, wherein the pillar comprises at least one actuating groove recessing inward from an outer wall of the pillar.

12. The testing apparatus of claim 11, wherein the at least one actuating groove comprises:
    a vertical region extending vertically from the bottom surface; and
    an inclined region extending upward from the vertical region in a tilt manner.

13. The testing apparatus of claim 1, further comprising:
    a reinforcing member disposed on the first surface; and
    a plurality of elastic members disposed between the reinforcing member and the holding assembly.

14. The testing apparatus of claim 1, wherein the probe card comprises a plurality of probes configured to contact a device under test positioned below the second surface.

15. A testing apparatus, comprising:
    a basic circuit board having a first surface and a second surface;
    a holding assembly disposed on the first surface; and
    a probe card carrier configured to carry a probe card, wherein the probe card carrier is assembled to the holding assembly from the first surface, and the second surface faces a device under test,
    wherein the holding assembly comprises an opening, and the probe card passes through the opening along a direction from the first surface to the second surface when assembling the probe card to the holding assembly.

16. The testing apparatus of claim 15, wherein the probe card carrier is dissembled from the holding assembly on the first surface.

17. The testing apparatus of claim 15, wherein the holding assembly comprises:

a mounting base disposed on the first surface; and
a movable member rotatably attached to the mounting base.

18. The testing apparatus of claim 17, wherein when the movable member rotates relative to the mounting base, the probe card carrier is moved along a direction from the first surface to the second surface.

19. The testing apparatus of claim 17, wherein the probe card carrier is assembled to the opening.

20. The testing apparatus of claim 19, wherein the mounting base comprises a plurality of guiding members protruding toward the opening.

21. The testing apparatus of claim 19, wherein the movable member comprises a plurality of actuating members protruding toward the opening, and when the movable member rotates relative to the mounting base, the probe card carrier is driven by the plurality of actuating members to move along a direction from the first surface to the second surface.

22. The testing apparatus of claim 15, wherein the probe card passes through the opening along a direction from the second surface to the first surface when disassembling the probe card from the holding assembly.

23. The testing apparatus of claim 15, wherein the probe card carrier comprises:
a pillar; and
a gripping portion disposed on a top surface of the pillar;
wherein the probe card is disposed on a bottom surface of the pillar.

24. The testing apparatus of claim 23, wherein the pillar comprises at least one guiding groove recessing inward from an outer wall of the pillar, and the at least one guiding groove extends vertically from the top surface of the pillar to the bottom surface of the pillar.

25. The testing apparatus of claim 23, wherein the pillar comprises at least one actuating groove recessing inward from an outer wall of the pillar.

26. The testing apparatus of claim 25, wherein the at least one actuating groove comprises:
a vertical region extending vertically from the bottom surface of the pillar; and
an inclined region extending upward from the vertical region in a tilt manner.

27. The testing apparatus of claim 15, further comprising:
a reinforcing member disposed on the first surface; and
a plurality of elastic members disposed between the reinforcing member and the holding assembly.

28. The testing apparatus of claim 15, wherein the probe card comprises a plurality of probes configured to contact a device under test below the second surface.

29. A holding assembly, comprising:
a mounting base;
a movable member rotatably attached to the mounting base; and
a probe card carrier placed on the movable member, wherein when the movable member rotates relative to the mounting base, causing the probe card carrier being moved along a direction from an upper side to a lower side of the mounting base.

30. The holding assembly of claim 29, further comprising an opening, and the probe card carrier is assembled to the opening.

31. The holding assembly of claim 30, wherein the mounting base comprises a plurality of guiding members protruding toward the opening.

32. The holding assembly of claim 30, wherein the movable member comprises a plurality of actuating members protruding toward the opening, and when the movable member rotates relative to the mounting base, the probe card carrier is driven by the plurality of actuating members to move along a direction from the upper side to the lower side of the mounting base.

33. The holding assembly of claim 29, wherein the probe card carrier is assembled to the movable member from the upper side of the mounting base.

34. The holding assembly of claim 29, wherein the probe card carrier is disassembled from the movable member from the upper side of the mounting base.

35. A probe card carrier, comprising:
a pillar;
a gripping portion disposed on a top surface of the pillar; and
a holding portion disposed on a bottom surface of the pillar;
wherein the pillar comprises at least one actuating groove recessing inward from an outer wall of the pillar, the at least one actuating groove comprising:
a vertical region extending vertically from the bottom surface of the pillar; and
an inclined region extending upward from the vertical region in a tilt manner.

36. The probe card carrier of claim 35, wherein the pillar comprises at least one guiding groove recessing inward from an outer wall of the pillar, and the at least one guiding groove extends vertically from the top surface of the pillar to the bottom surface of the pillar.

37. The probe card carrier of claim 35, further comprising a probe card disposed on the holding portion, wherein the probe card comprises a plurality of probes.

* * * * *